United States Patent [19]

Bhattacharya et al.

[11] Patent Number: 5,748,647
[45] Date of Patent: May 5, 1998

[54] LOW COST TESTING METHOD FOR REGISTER TRANSFER LEVEL CIRCUITS

[75] Inventors: Subhrajit Bhattacharya; Sujit Dey, both of Plainsboro, N.J.

[73] Assignee: NEC USA, Inc., Princeton, N.J.

[21] Appl. No.: 741,990

[22] Filed: Oct. 31, 1996

[51] Int. Cl.$^6$ .................................................. G01R 31/28
[52] U.S. Cl. ........................................ 371/22.31; 364/488
[58] Field of Search ........................ 371/22.31, 22.32, 371/22.34, 22.5, 25.1, 27.1, 27.4, 27.5; 395/183.06; 364/488–490, 550, 578; 324/765, 73.1

[56] References Cited

U.S. PATENT DOCUMENTS

| | | | |
|---|---|---|---|
| 5,502,730 | 3/1996 | Roy et al. | 371/22.3 |
| 5,513,118 | 4/1996 | Dey et al. | 364/490 |
| 5,513,123 | 4/1996 | Dey et al. | 364/489 |
| 5,550,749 | 8/1996 | Dey et al. | 364/489 |

OTHER PUBLICATIONS

S. Bhattacharya et al., H–scan: A high level alternative to full scan testing with reduced area and test application overhead, VLSI test Symposium, Apr. 1996, pp. 74–80.

M. Potkonjak et al., "Behavioral synthesis of area–efficient testable design using interaction between hardware sharing and partial scan", IEEE Trans. on computer–aided design; pp.1141–1154, Sept. 1995.

S. Narayanan et al., "Reconfigurable scan chains: A novel approach to reduce test application time", Proceedings of ICCAD, pp. 710–715, Sep. 1993.

C. C. Lin et al., "Cost–free Scan: A low overhead scan path design methodology", Proceedings of ICCAD, pp. 528–533, Jul. 1995.

T. Riesgo et al., "CAD in test", Industrial electronics, 1995 International Symposium, pp. 33–38, Jan. 1995.

L. Avra, "Allocation and assignment in high–level synthesis for self–testable data paths", International test conference, 1991, pp. 463–472, Jan. 1991.

Thomas W. Williams et al., "Design for Testability–A Survey", Proceedings of the IEEE, vol. 71, No. 1, Jan. 1983, pp.311–325.

E.B. Eichelberger et al., "A Logic Design Structure for LSI Testability", 14$^{th}$ Design Automation Conference, ACM/IEEE, Jun. 1977, pp. 462–468.

Kwang–Ting Cheng et al., "A Partial Scan Method for Sequential Circuits with Feedback", IEEE Transactions on Computers, vol. 39, No. 4, Apr. 1990, pp. 544–548.

D.H. Lee et al., "On Determining Scan Flip–Flops in Partial–Scan Designs", Proceedings of the International Conference on Computer–Aided Design, Nov. 1990, pp. 322–325.

Vivek Chickermane et al., "An Optimization Based Approach to the Partial Scan Design Problem", 1990 International Test Conference, Sep. 1990, pp 377–386.

Bapiraju Vinnakota et al., "Synthesis of Sequential Circuits for Parallel Scan", Proc. of the European Conference on Design Augomation, Mar. 1992, pp. 366–370.

(List continued on next page.)

*Primary Examiner*—Robert W. Beausoliel, Jr.
*Assistant Examiner*—Nadeem Iqbal
*Attorney, Agent, or Firm*—Jeffery J. Brosemer

[57] ABSTRACT

An alternative method for testing circuits (H-SCAN) which retains the main advantage of full scan testing, namely, the ability to use combinational automatic test pattern generation (ATPG), while eliminating the high area overhead the long test application time associated with full, scan test methods. The method provides a practical test methodology that can be easily applied to any RT-level specification. The method uses existing connections of registers and other structures available in a high-level specification of a circuit without necessitating the use of scan flip-flops. Test application time is reduced by using the parallelism inherent in the circuit design to load multiple flip-flops in a single clock cycle, without having to add parallel scan chains as done in traditional parallel scan approaches.

6 Claims, 10 Drawing Sheets

OTHER PUBLICATIONS

Sridhar Narayanan et al., "Reconfigurable Scan Chains: A Novel Approach to Reduce Test Application Time", Proc. of ICCAD, 1993, pp. 710–715.

Catherine H. Begotys et al., "Integraion of Algorithmic VLSI Synthesis with Testabilty Incorporation", IEEE Journal of Solid–State Circuits, vol. 24, No. 2, Apr. 1989, pp. 409–416.

Chung–Hsing Chen et al., "Structural and Behavioral Synthesis for Testability Techniques", IEEE Transactions on Computer–Aided Design of Integrated Circuits and Systems, vol. 13, No. 6,Jun. 1994, pp. 777–785.

Subhrajit Bhattacharya et al., "Clock Period Optimization During Resource Sharing and Assignment", $31^{st}$ ACM/IEEE Design Automation Conference, 1994, pp. 195–200.

Thomas Niermann et al., "HITEC: A Test Generation Package for Sequential Circuits", Proc. EDAC, 1991, pp. 214–218.

S.T. Chakradhar et al., "A Transitive Closure Algorithm for Test Generation", IEEE Transactions on Computer Aided Design of Integrated Circuits and Systems, vol. 12, No. 7, Jul. 1993, pp. 1015–1028.

ENTITY gcd IS
PORT(reset : IN bit; - Global reset
   rst : IN boolean;
   xin, yin : IN nat16;
   rdy : OUT boolean; oup : OUT nat16);
END gcd;

ARCHITECTURE a3d OF gcd IS
BEGIN gcd: PROCESS
   VARIABLE x, y, h : nat16;
BEGIN
1.  rdy ⇐ true;
2.  oup ⇐ zero;
3.  RESET_LOOP : LOOP
4.    wait for 0 ns; - WAIT UNTIL clk = '1';
5.    EXIT RESET_LOOP WHEN reset = one_b2
6.    loop - WHILE (rst = true) LOOP
7.      x := xin;
8.      y := yin;
9.      wait for 0 ns; - WAIT UNTIL clk = '1';
10.     EXIT RESET_LOOP WHEN reset = one_b2;
11.     exit when rst = false;
12.   END LOOP;
13.   IF (x ≠ zero) AND (y ≠ zero) THEN
14.     rdy ⇐ false;
15.     oup ⇐ zero;
16.     loop - WHILE (y ≠ zero) LOOP
17.       WHILE (x ≥ y) LOOP
18.         EXIT RESET_LOOP WHEN reset = one_b2;
19.         x := x - y;
20.       END LOOP
21.       h := x; x := y; y := h;
22.       exit when y = zero;
23.     END LOOP;
24.   END IF;
25.   rdy ⇐ true;
26.   oup ⇐ x;
   END LOOP RESET_LOOP
END PROCESS gcd;
END a3d

FIGURE 1

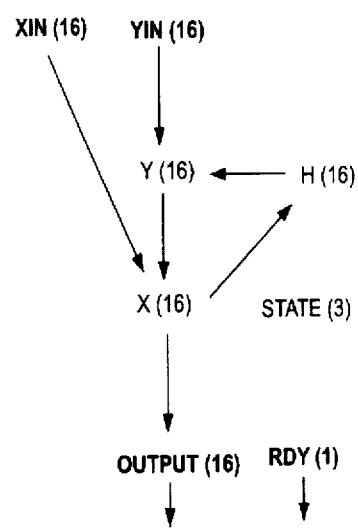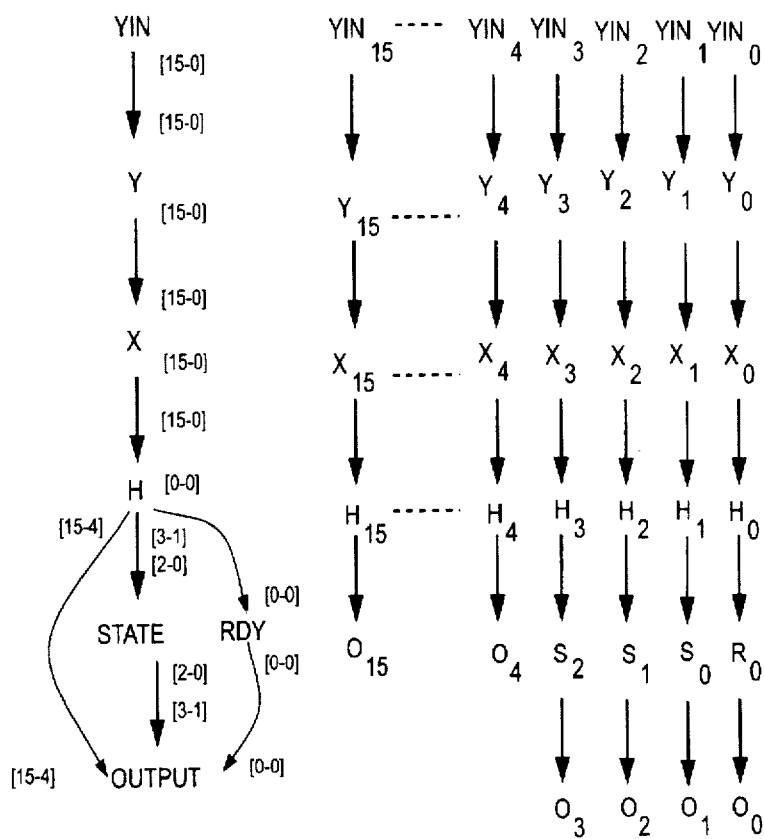
FIGURE 6(a)  FIGURE 6(b)  FIGURE 6(c)

```
ENTITY change2 IS
PORT(
    clk: IN bit;
    my_reset: IN boolean;
    item_stb: IN boolean;
    total,price: IN nat8;
    num_coins: IN nat8;
    coin: OUT BIT;
    exact_change: OUT boolean;
    change_stb : OUT boolean;
    sel_enable: OUT boolean
);
END change2;

ARCHITECTURE scheduled of change2 IS
    signal state: states := s0;
BEGIN change2: PROCESS VARIABLE dime_out: nat8;
    VARIABLE nickel_out: nat8;
    VARIABLE int_change: nat8;

BEGIN
1.  wait until (clk='1' AND clk'event);
2.  CASE state IS

3.  WHEN s0 =>
4.      IF (item_stb = '1') THEN
5.          IF (my_reset > '0') THEN
6.              dime_out := num_coins;
7.              nickel_out := dime_out;
8.              sel_enable <= true;
9.              state <= s0;
10.         ELSE
11.             IF (total > price) THEN
12.                 int_change := total - price;
13.                 sel_enable <= false;
14.                 state <= s1;
15.             ELSE
16.                 sel_enable <= true;
17.                 state <= s0;
18.             END IF;
19.         END IF;
20.     ELSE
21.         state <= s0;
22.     END IF;

23. WHEN s1 =>
24.     IF (int_change > 0) THEN
25.         state <= s2;
26.     ELSE
27.         sel_enable <= true;
28.         state <= s0;
29.     END IF;

30. WHEN s2 =>
31.     IF (int_change > 5) AND (dime_out > 44) THEN
32.         coin <= dime;
33.         int_change := int_change - ten;
34.         dime_out := dime_out - 1;
35.         state <= s3;
36.     ELSE
37.         coin <= nickel;
38.         int_change := int_change - 5;
39.         nickel_out := nickel_out - 1;
40.         state <= s3
41.     END IF 42. WHEN s3 =>
43.     change_stb <= '1';
44.     IF (dime_out < 45) AND (nickel_out < 90) THEN
45.         exact_change <= true;
46.         state <= s4;
47.     ELSE
48.         exact_change <= false;
49.         state <= s4;
50.     END IF;

51. WHEN s4 =>
52.     change_stb <= '0';
53.     state <= s1;

54. END CASE;
END PROCESS change2;
END scheduled;
```

FIGURE 7

LOW COST TESTING METHOD FOR REGISTER TRANSFER LEVEL CIRCUITS

TECHNICAL FIELD

This invention relates to a method for testing electronic circuits and in particular to a method for testing sequential circuits that allows the use of combinational test patterns without the high area overhead and long test application time associated with full-scan testing.

DESCRIPTION OF THE PRIOR ART AND PROBLEM

Despite recent advances in sequential automatic test program generation techniques (ATPG), test pattern generation for sequential circuits remains a difficult task, and requires enormous computing resources to generate tests for even modest-sized sequential circuits. Consequently, a wide range of design-for-testability (DFT) approaches have been proposed which aid the process of test pattern generation for sequential circuits. (See, for example, T. W. Williams and K. P. Parker, "Design for Testability—a Survey", *Proceedings of the IEEE*, 71(1)98–112, January, 1983, and E. Eichelberger and T. Williams, "A Logic Design Structure for LSI Testability", 14*th* *Design Automation Converence, ACM/IEEE*, pp. 462–468, June, 1977)

Full scan testing methods, where all of the flip-flops (FFs) of a circuit are made controllable and observable while in a test mode, effectively resolves the sequential ATPG problem by converting the sequential circuit into a combinational circuit for the testing. Additionally, the ability of combinational ATPG programs to handle large industrial circuits, coupled with the relative ease with which a full-scan methodology may be incorporated, has made full-scan testing widely used in industry.

Nevertheless, full-scan methodology suffers from two serious infirmities, namely high area overhead and long test application time. The area overhead of full-scan designs comes from the need to replace FFs with scan FFs, and the routing and buffering overhead associated with the scan clock and the scan chain. The long test application time results from the need to shift the test vectors through the scan chain.

In particular, for typical high-volume, low-cost applications, a 20%–30% area overhead that is associated with full-scan testing may not be economically viable. Similarly, the prolonged tester time associated with such tests may be impractical as well. Consequently, the prior art has expended considerable effort to find viable alternatives to the full-scan testing methods.

Recently, several partial scan techniques have been developed in an attempt to overcome the noted shortcomings of full-scan methods. See, for example, K. T. Cheng and V. D. Agrawal, "A Partial Scan Method for Sequential Circuits with Feedback", *IEEE Transactions on Computers*, 39(4) :544–548, April 1990, D. H. Lee and S. M. Reddy, "On Determining Scan Flip-Flops in Partial-Scan Designs", *Proceedings of the International Conference on Computer-Aided Design*, pp. 322–325, November 1990, and V. Chickermane and J. H. Patel, "An Optimization Based Approach to the Partial Scan Design Problem", *Proceedings of the International Test Conference*, pp. 377–386, September 1990. Unfortunately, these prior-art partial scan techniques require the use of an efficient sequential automatic test pattern generation (ATPG) tool to ensure that the partial scan has sufficiently less scan FFs than a full scan.

Recent attempts at developing methods that reduce the test application time have met with limited success. Such methods typically involve arranging scan flip flops in parallel scan chains or reconfiguring scan chains. (See, for example, B. Vinnakota and N. K. Jha, "Synthesis of Sequential Circuits for Parallel Scan", *Proc.. of the European Conference on Design Augomation*, pp. 366–370, March, 1992; S. Narayanan and M. A. Breur, *Reconfigurable Scan Chains: A Novel Approach to Reduce Test Application Time*, Proc. of ICCAD, pp. 710–715, 1993.)

More recently, behavioral level design and synthesis approaches have been proposed to generate easily testable circuits for both Built-In-Self-Test (BIST) based testing such as that shown by C. H. Gebotys and M. I. Elmasry in an article entitled "Integration of Algorithmic VLSI Synthesis with Testability Incorporation" which appeared in the *IEEE Journal of Solid-State Circuits*, 24(2), pp. 458–462, April 1989, and sequential ATPG methods such as that described by C. H. Chen, T. Karnik and D. G. Saab in an article entitled "Structural and Behavioral Synthesis for Testability Techniques", which appeared in *IEEE Transactions on Computer-Aided Design*, 13(6), pp. 777–785, June, 1994.

Unfortunately, prior-art, high-level, DFT/synthesis approaches produce a circuit which is amenable only to a chosen DFT/testing method, such as partial scan, sequential ATPG or BIST. Moreover, they are only applicable to data-flow/arithmetic intensive designs, like DSP filters and processor designs which are characterized a dominance of functional units in the data paths.

Consequently, a continuing need exists for circuit test methods which use combinational test patterns, high-level circuit specifications requiring minimal test hardware, significantly reduce the test application time as compared to full scan or parallel scan, that do not simply generate particular, easy-to-test circuits, amenable only to a single test methodology.

SUMMARY OF THE INVENTION

The present invention provides an alternative testing method (H-SCAN) which retains the main advantage of full-scan testing, namely, the ability to use combinational ATPG, while eliminating the disadvantages, and in particular, the high area overhead and long test application time associated with full-scan methods.

The H-SCAN method provides a practical test (DFT+ATPG) methodology that can be easily applied to any RT-level specification. H-SCAN utilizes existing connections of registers and other structures available in the high level specification of a circuit to load a combinational test pattern into the circuit FFs without necessitating the use of scan FFs.

Test application time is significantly reduced by using the paralellism inherent in the circuit design to load multiple FFs in a single clock cycle, without having to add parallel scan chains as done in traditional parallel scan approaches.

In case of circuits with limited number of output pins, H-SCAN significantly reduces the test application time over parallel scan approachs. In particular, with HSCAN the test responses captured in the FFs are analyzed using existing on-chip comparators instead of scanning out the contents of the FFs in parallel, thereby eliminating limitations imposed by having a small number of output pins.

Further features and advantages of the present invention, as well as the structure and operation of various embodiments of the present invention are described in detail below with reference to the accompanying drawings.

BRIEF DESCRIPTION OF THE DRAWINGS

The teachings of the present invention can be readily understood by considering the following detailed description in conjunction with the accompanying drawings, in which:

FIG. 1 is a program listing showing the VHDL code for the behavior of the GCD circuit;

FIG. 6(a) is a connectivity graph showing parallel connection paths existing in the GCD circuit;

FIG. 6(b) shows H-SCAN paths created in the circuit of FIG. 6(a);

FIG. 6(c) shows bit level H-SCAN paths for the circuit of FIG. 6(a)

FIG. 7 is a program listing showing VHDL code for the scheduled behavior of the vendor change_maker process;

DETAILED DESCRIPTION

A preferred embodiment of the invention will now be described while referring to the figures, several of which may be simultaneously referred to during the course of the following description.

Figure 2:
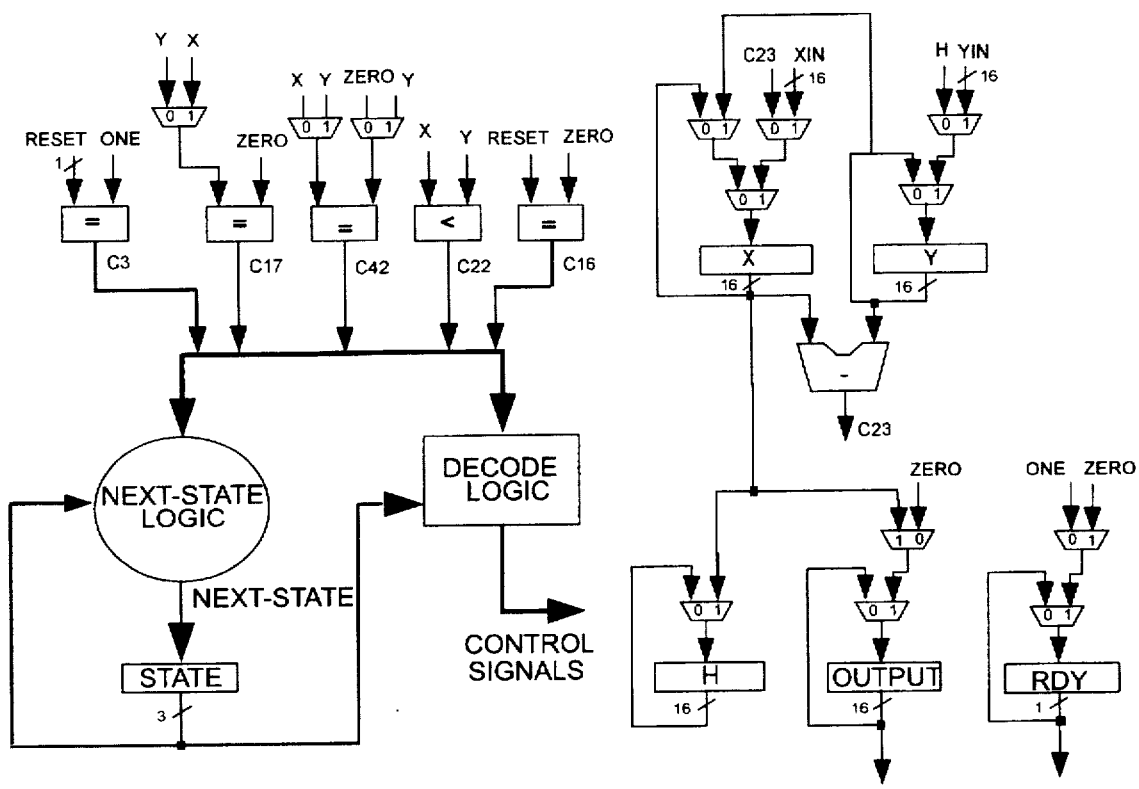
FIG. 2 is a block diagram showing the Register Transfer Level (RTL) implementation of GCD.

With reference now to FIG. 1, there it shows the behavioral description, in VHDL code, for a GCD circuit. The description specifies a method for computing the greatest common divisor (GCD) of two 16 bit numbers, xin and yin. The behavioral specification is synthesized into an RT level specification as shown in FIG. 2.

Every operation in the behavioral specification is executed on a functional unit in the RTL circuit. The registers, such as X and Y, are used to store the intermediate values of the variables in the algorithmic description. In the method shown, X is assigned from XIN, Y, and the subtract operation on line 19 of FIG. 1. Therefore, the register corresponding to X in the RTL description has inputs from the circuit input XIN, the register Y, and the output of the subtractor unit c23 on which the subtract operation is performed.

These inputs are selected using the multiplexor tree at the input of the register X. The multiplexor tree has an input from the register X itself. This is because, in certain clock cycles, X is not assigned from the other three sources, and its value needs to be held to be used in later clock cycles. The circuit has a 16 bit output OUTPUT, and a 1 bit output RDY. The output OUTPUT assumes the value of the GCD of the inputs XIN and YIN when the RDY output goes high.

Figure 3:
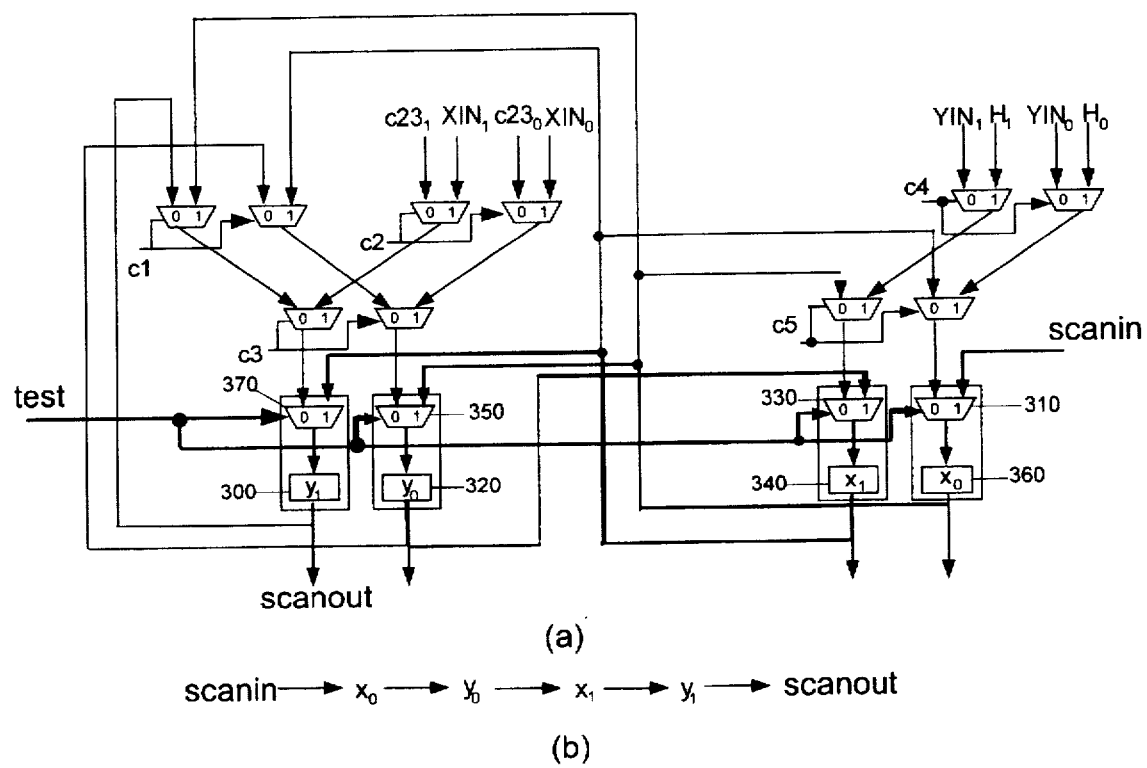
FIG. 3 is a block diagram showing the scan implementation of a GCD subcircuit.

By way of example, we first show the overhead that is incurred to test the GCD circuit using traditional full scan methodology. For the purpose of the example, consider a subcircuit of the GCD circuit of FIG. 2. The example subcircuit is shown in FIG. 3, with the necessary modifications/additions done for full scan. Note that the subcircuit has 2 flip-flops (of the 16 flip-flops) of each of the registers X and Y in the original circuit and the corresponding one bit mutiplexors.

It can be seen that the scan implementation creates the following scan chain: (scanin→$Y_0$→$X_0$→$Y_1$→$X_1$→scanout). The chain consists of all the four FFs (300, 320, 340, 360) in the circuit connected by multiplexors (310, 330, 350, 370) with the primary input scanin as the input to the chain, and the primary output scanout as the output of the chain.

When the test input becomes a high state, the FFs start behaving as a shift register which can be used to shift in the test pattern using the scanin input. To apply the test vector to the circuit, the test signal is made low. The circuit response captured in the FFs is then shifted out through the scanout pin by making the test input high.

The disadvantageous of such a scan scheme are numerous. First, each of the 68 FFs in the circuit has to be replaced by a scan FF exhibiting the functionality of a regular FF with a multiplexor at the input. Second, extra routing is required to connect the scan chain, and the test pin to the 68 multiplexors in the scan FFs. Lastly, in an actual implementation, buffers have to be added between the test pin and the multiplexor inputs because of the high fanout of the test signal.

As can be seen from the results shown in Table 1, the area overhead to incorporate full scan for the GCD circuit is approximately 17% and the test application time is very long. Additionally, a combinational test pattern generator was used and generated 260 patterns to test all the faults in GCD. Since there are 68 FFs in the circuit, 69 clock cycles are required to load each pattern into the FFs and then apply the test pattern. The total number of clock cycles required to test this circuit can then be calculated to be 18007.

The above disadvantages can be significantly reduced or eliminated by using paths already existing in the RTL circuit. As previously discussed, scan implementations connect FFs in scan chains through multiplexors which can be used to shift patterns into and out of the FFs.

Figure 4:
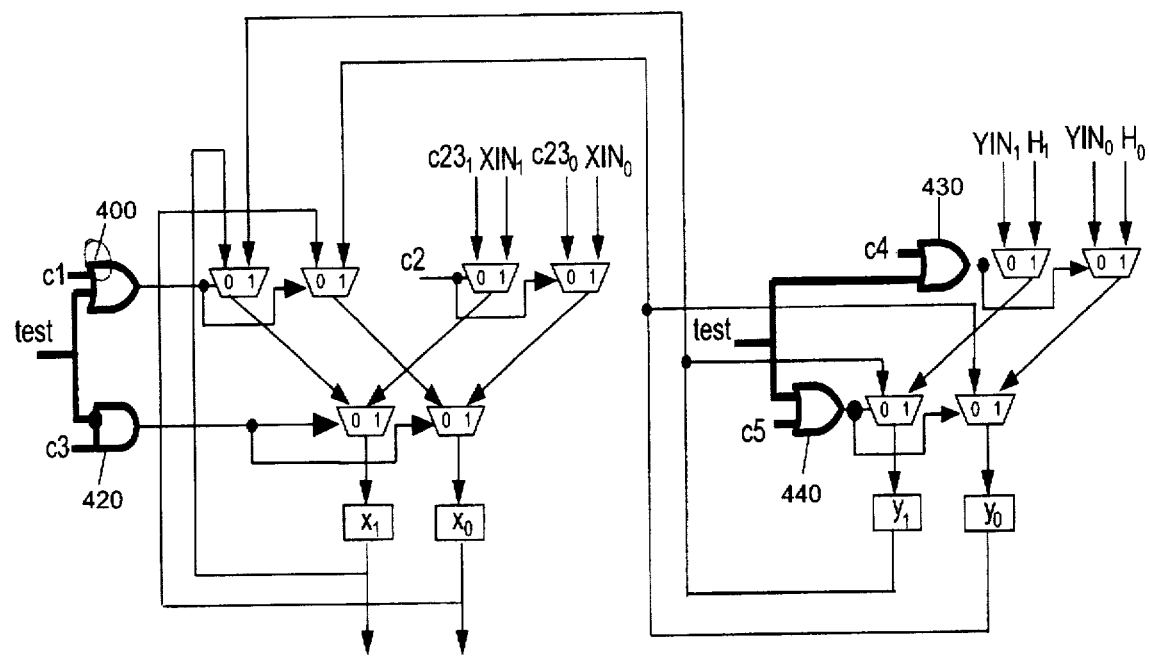
FIG. 4 is a block diagram showing the H-SCAN implementation of a GCD subcircuit according to the teachings of the present invention.

Consider again the circuit shown in FIG. 4, which is the H-SCAN implementation of the same subcircuit of the GCD used in FIG. 3. The additions due to H-SCAN consists of only the four gates (400, 410, 420, 430) shown in bold. Note that the following paths that pass through multiplexors only already exist in the circuit:

$$YIN_0 \rightarrow Y_0 \rightarrow X_0; \text{ and } YIN_1 \rightarrow Y_1 \rightarrow X_1.$$

Since $YIN_0$ and $YIN_1$ are inputs, and if one assumes that $X_0$ and $X_1$ are primary outputs, then the basic structure required for two parallel scan chains in the original circuit itself exists. As one skilled in the art can see from FIG. 4, two AND gates and two OR gates must be added along with the test input in order to force these two chains to scan in a test pattern in the test mode,.

Several parallel paths which can be used to scan in test patterns as discussed above already exist in the GCD circuit. As a point of clarification, when we say that a path exists between two registers, we refer to a path that goes through only multiplexors. The paths between registers in the GCD circuit of FIG. 2 is shown by the connectivity graph in FIG. 6(a). Note for example, in FIG. 2, the 16 bit input YIN is connected to the 16 bit register Y through two 16 bit multiplexors.

Figure 5:
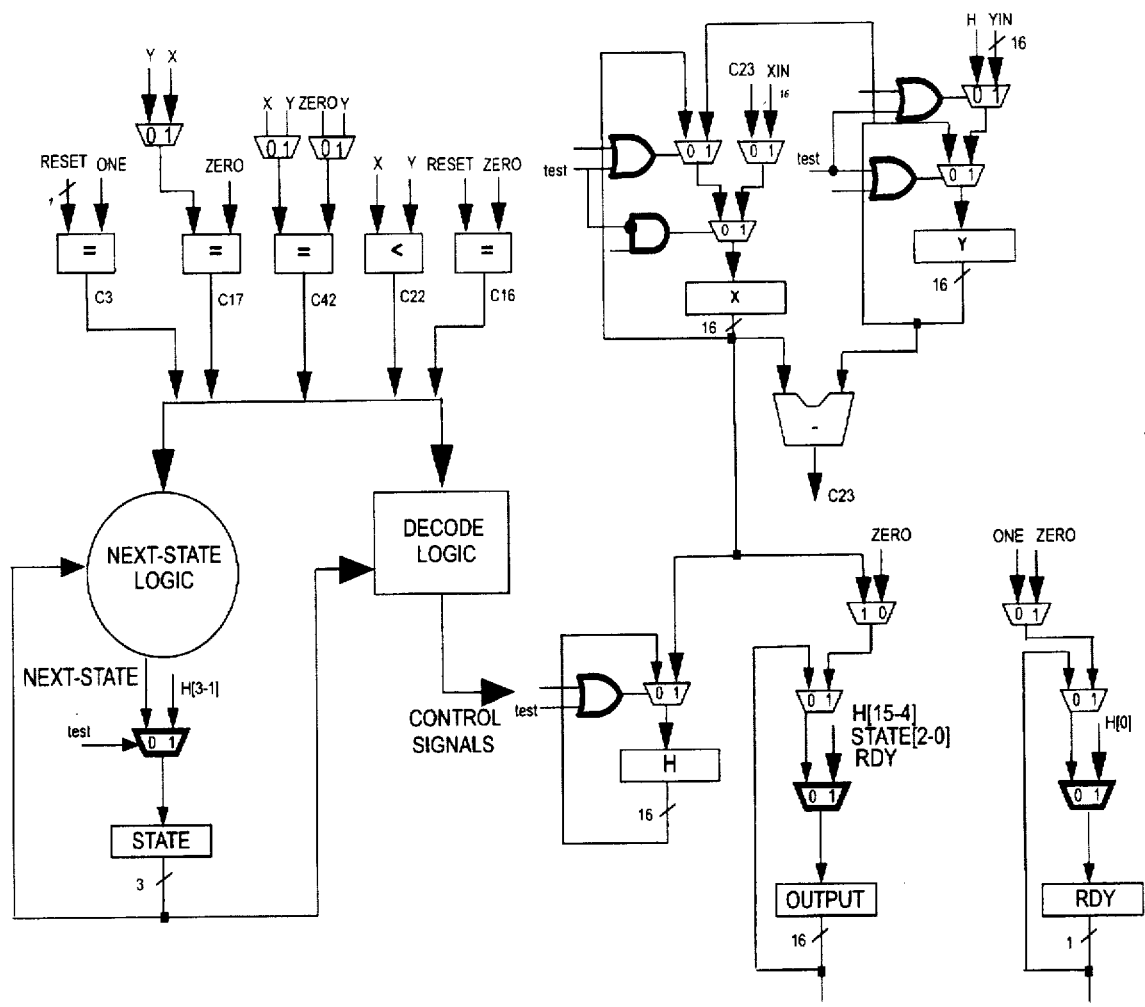
FIG. 5 is a block diagram showing the H-SCAN implementation of the GCD circuit according to the teachings of the present invention.

Corresponding to this path, there is a edge between nodes YIN and Y in the connectivity graph of FIG. 6(a). FIG. 5 shows the complete RT level GCD circuit, along with the test circuitry added to it by the method of the present application to control the parallel paths during testing. A conceptual view of the paths used for scanning in test patterns into the GCD circuit are shown in FIG. 6(b) and a bit level view of the same paths are shown in FIG. 6(c).

Several points need to be noted. First, the paths shown in FIG. 6(b) may have bitwidth greater than 1. Furthermore, since there is shown an arrow from YIN[15-0] to Y[15-0], it corresponds to 16 parallel paths. Similarly, the arrow shown from H[3-1] to state[2-0], corresponds to 3 parallel paths.

Second, note that in the original circuit, there is a path corresponding to many of the paths in FIG. 6(b), as shown in the connectivity graph of FIG. 6(a). For example, there is a path from YIN to Y in the GCD circuit. In fact, the arrows in FIG. 6(b) for which there are no corresponding paths that pass through only multiplexors in the original circuit are: H[15-4] to OUTPUT[15-4], H[3-1] to state[2-0], H[0-0] to RDY[0-0], state[2-0] to OUTPUT[3-1], and RDY[0-0] to OUTPUT[0-0].

To create these paths in the GCD circuit, nineteen 1 bit multiplexors have to be added as shown in FIG. 5. Thus, the H-SCAN method utilizes paths through multiplexors existing in a RT level circuit to create parallel scan chains at the RT level, adding extra multiplexors only when necessary.

Area Overhead Reduction

At this point, it is useful to analyze the area overhead resulting from using the H-SCAN method of the present application and compare it with a conventional SCAN implementation. Those skilled in the art will quickly recognize that there are two components to the area overhead, the overhead due to the multiplexors which have to be added and the overhead due to AND/OR gates that have to be added to control the multiplexors during the test mode.

Like conventional scan schemes, H-SCAN creates scan paths between FFs. However, unlike conventional scan schemes, it uses RT Level information to reuse paths between FFs through multiplexors that already exist in the circuit. When such a path does not exist, H-SCAN introduces a multiplexor.

As can be seen from FIG. 5, H-SCAN introduced 19 one bit multiplexors for GCD. This is in sharp contrast to the 68 necessary for full scan. This is due, in part, to the fact that when there is a path through multiplexors between two FFs which have been selected to be on the same scan chain, H-SCAN does not introduce multiplexors, but only introduces gates in the control logic to control the path during the test mode.

By way of example, consider the 16 bit parallel path from YIN to Y through two 16 bit multiplexors in FIG. 5. To control the multiplexors during testing, two OR gates are introduced. One of the inputs to the OR gate is the original control signal to the multiplexor, the second input is the test input. When test is high, all 16 bits of YIN get connected in parallel to Y.

As can be seen, each of the two 16 bit multiplexors has a single control signal. Therefore, only one OR gate is needed for each of the 16 bit multiplexors. Traditional scan methods would have replaced the 16 FFs corresponding to Y with 16 scan FFs, where each scan FF includes a regular FF and a multiplexor.

A hidden cost associated with area overhead analysis concerns the extra wiring introduced by the scan implementation schemes. Specifically, consider the FFs corresponding to YIN and Y for which a path already exists in the original circuit. In the case of traditional scan, not only would it be necessary to substitute 16 FFs corresponding to Y with 16 scan FFs, it would be necessary to route the nets connecting each scan FF in a scan chain, and also necessary to route the test input to the control input of each of the one bit multiplexors in the 16 scan FFs.

In contrast, in the H-SCAN method which is the subject of the present application, the test input has to be routed to only two OR gates. The outputs of the OR gates replaces the control signal for the muxes in the original circuit. Hence there is no extra area overhead for routing the output of the OR gate to the multiplexors. Significantly, the final layout area overhead of H-SCAN is only 5% as compared to 17% for a full scan implementation.

Test Application Time Overhead

As shown in FIG. 6, there are 16 effective scan chains in parallel in the circuit synthesized by the H-SCAN method. Note however, that 4 of the chains have a length of 5, while the remaining 12 have a length of 4. The implication of having the unbalanced chains are, when loading the FFs, in the first clock cycle, the values of $O_3$ to $O_0$ will be loaded through $YIN_3$ to $YIN_0$. Hence, the inputs $YIN_{15}$ to $YIN_4$ will not be utilized in the first clock cycle. Therefore, the number of bits of test data that are loaded in parallel is effectively 68+5, or 13.6. However, it is much higher compared to the 1 bit loaded per clock cycle for traditional scan.

For quantitative comparison, the test application time using traditional, full scan methods and the test application time using the H-SCAN method of the present application may be calculated. Specifically, the GCD circuit has 68 FFs. To load each test pattern using traditional scan, 68 clock cycles are required. One clock cycle is required to apply the test pattern. 67 clock cycles are required to flush out the FFs after the last test pattern has been applied.

It is possible to further reduce test application time over that previously discussed when the number of outputs of the circuit limits the number of parallel scan chains that can be formed. This is illustrated by the change_maker circuit whose VHDL behavioral description is given in FIG. 7.

The change_maker circuit is one of the three subcircuits comprising a controller for a vending machine and the description specifies which operations are to be executed in which state (clock cycle) as well as the conditions of transition from one state to another. The operations in each state of the schedule are executed in 1 clock cycle.

Other than the clock input, the change_maker circuit has inputs my_reset (1 bit), item_stb (1 bit), total (8 bits), price (8 bits), and num_coins for a total of 26 input pins. The outputs are coin (1 bit), exact_change (1 bit), change_stb (1 bit), and sel_enable (1 bit) for a total of 4 output pins.

There are three 8 bit internal variables, dime_out, nickel_out, and int_change. There is another internal variable, state, which requires 3 bits to encode the 5 states, $s_0$ to $s_4$. Corresponding to each of these internal variables, the RT level implementation has three 8 bit registers and one 3 bit register. Also, for each of the four 1 bit outputs, there is a FF, for a total of 31 FFs in the circuit. Hence, in this circuit, there are a maximum of 4 (=minimum(18, 31, 4)) parallel scan chains using a traditional parallel scan scheme.

Figure 8:
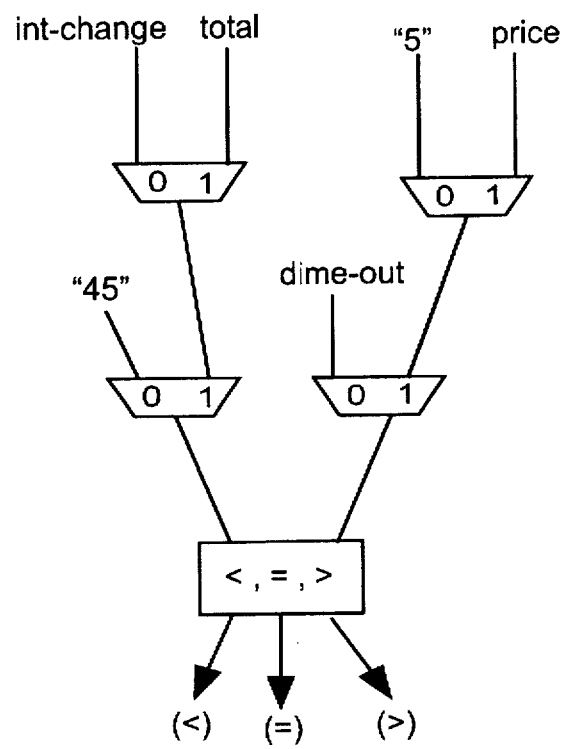
FIG. 8 is a block diagram of a subcircuit from the RTL implementation of the change_maker circuit.

Turning our attention now to FIG. 8, the part of the RT Level circuit for the change_maker, essential to our discussion, is a comparator. Referring now to the VHDL description of change_maker shown in FIG. 7, the comparison operations which are executed on the comparator are (total>price) (line 11), (int_change>5) (line 31), and (dime_out<44) (line 44).

The three operations can be executed or shared on the same resource since they are executed in different states (given by the variable state) $s_0$, $s_2$, and $s_3$ respectively, and hence are never executed simultaneously in the same clock cycle. Note that, even though price is never compared to int_change in the scheduled behavioral description, comparator sharing makes them inputs to the same comparator.

A connectivity graph of the registers in change_maker and the comparator discussed previously are shown in FIG. 9. The arrows indicate connections, through one or more multiplexors. For example, from FIG. 8 one can see that price and int_change are connected to the comparator through 2 multiplexors. The connection through multiplexors is represented by the arrow from int_change to the comparator, and another from price to the comparator.

Figure 10:
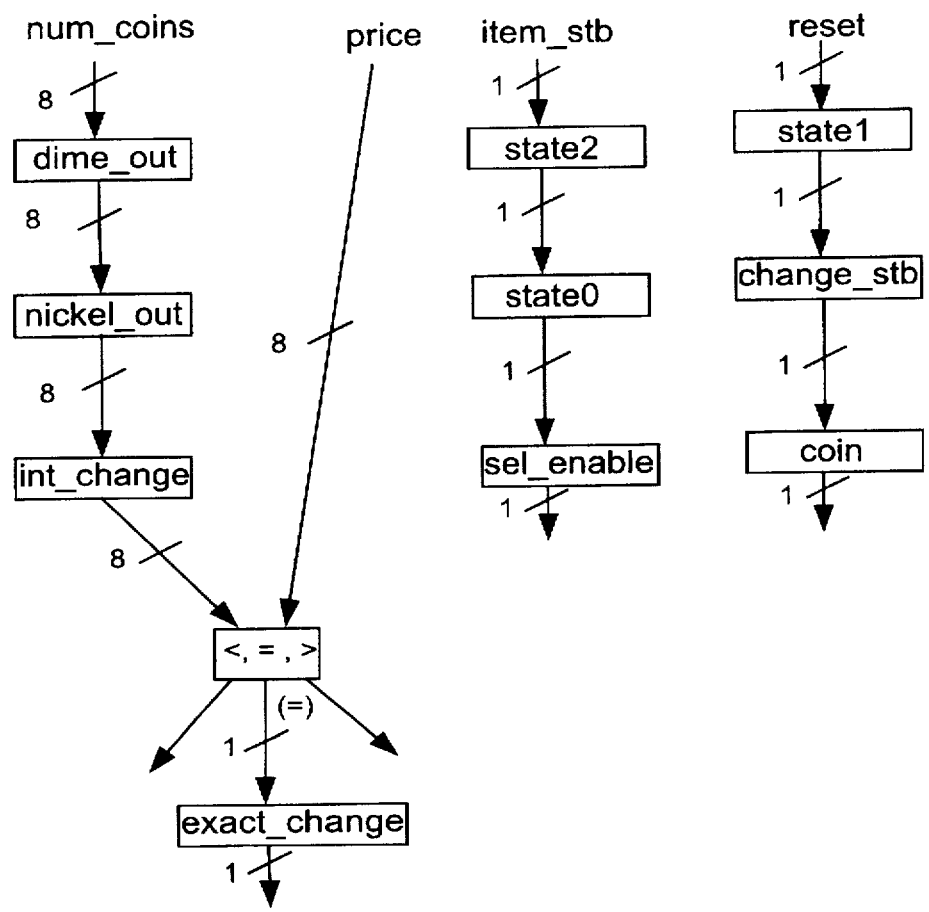
FIG. 10 is a block diagram showing the chains created by H-SCAN for the change_maker circuit according to the teachings of the present invention.

As is shown in FIG. 10, however, even though the circuit has 4 outputs, we can have 10 parallel scan chains by using the comparator, which already exists in the circuit. There are two traditional scan chains in FIG. 10:

(item_stb→state(2);→state(0)→sel_enable), and (my_reset→state(1)→change_stb→coin).

The third chain consists of the following registers namely, (num_coins→dime_out→nickel_out→int_change→exact_change). This latter chain, which we call an augmented scan chain, has two notable characteristics. First, it has a comparator between int_change and exact_change. Second, the chain from num_coins to int_change has a bitwidth of 8 while the last register exact_change has a bitwidth of only 1. Note that among the connections required for the H-SCAN method, the 8 bit connections (num_coins→dime_out→nickel_out) are already present in the original circuit as shown in the connectivity graph in FIG. 9.

It can be seen that the FFs in the registers dime_out, nickel_out and int_change can be loaded in parallel since the input to the chain, num_coins, is 8 bits wide. To load the 1 bit register exact_change, we make use of the comparators (=) output which is '1' when int_change and price have same bit patterns, and is '0' when int_change and price have different bit patterns.

As an illustration, let us assume we have to load the following pattern into the registers in the augmented scan chain for testing a fault in the circuit:

dime_out="00000010", nickel_out="00000100", int_change="00001000", exact_change='1'

Then the following patterns have to applied to the inputs num_coins and price in successive clock cycles, where an 'x' implies a don't_care.

| Clock Cycle | num_coins | price |
|---|---|---|
| 1 | 00000000 | xxxxxxxx |
| 2 | 00001000 | xxxxxxxx |
| 3 | 00000100 | xxxxxxxx |
| 4 | 00000010 | 00000000 |

Note that the pattern "00000000" loaded into num_coins in clock cycle 1 gets loaded into int_change in clock cycle 4 and is compared with the pattern "00000000" applied to price to load a '1' into exact_change.

To load a '0' into exact_change, in the fourth clock cycle, the pattern "00000001" may be applied to price. Note that each of the 8 bit registers dime_out, nickel_out and int_change can be loaded in 1 clock cycle, and exact_change also requires 1 clock cycle to be loaded. Hence, a total of 4 clock cycles is required for loading the 25 FFs in the chain instead of 25 clock cycles required for traditional scan.

The contents of register exact_change can be observed in 1 clock cycle. However, since dime_out is an 8 bit register, it is not possible to observe its contents in 1 clock cycle at the output of the chain which is 1 bit wide. Similarly, the contents of the 8 bit wide registers nickel_out and int_change can not be observed in 1 clock cycle each. However, since the expected value of these registers after applying the test vector is known, the expected values can be applied to the input price, and the output of the comparator can be sampled at the primary output to detect faults.

Let us assume that after loading the above 4 patterns in 4 clock cycles, the pattern is applied to the circuit in the 5th clock cycle. The response of the fault free circuit to the test pattern should be:

dime_out="01100010", nickel_out="00100001", int_change="11010011", exact_change='1'.

The following patterns are then applied to the input price in the next 3 clock cycles:

| Clock Cycle | num_coins | price |
|---|---|---|
| 6 | xxxxxxxx | 01100010 |
| 7 | xxxxxxxx | 00100001 |
| 8 | xxxxxxxx | 11010011 |

If the response of the circuit captured in any of the above registers does not correspond to the response of the fault free circuit, then the output of the comparator will be '0'. Since the comparator output can be observed through exact_change, there is a fault in the circuit if the output exact_change is '0'

Thus, applying the expected test response of the circuit to the inputs, and comparing them on chip using existing comparators, detects faults captured in the 8 bit registers in 1 clock cycle.

It should be noted that the tasks of loading the FFs and observing the circuit response captured in them can be overlapped, similar to the overlapping of the scan in and scan out tasks in a regular scan scheme.

At this point, it is possible to present a complete overview of H-SCAN, the testing method of the present application. Generating the RTL Circuit with Minimal Scan/Augmented Scan Chains I. The connectivity graph captures certain paths that exist in the RTL circuit which can be used for creating a scan chain or an augmented scan chain, henceforth referred to simply as a chain. The connectivity graph can be defined as follows:

1. There is a node in the graph for every variable in the RTL circuit, where a variable is either a register, an input, or an output. The clock input does not have a corresponding node.

2. There is a node in the graph for every comparator which has the = functionality, and one of whose inputs is a circuit input.

3. There is a directed path between two nodes in the graph, if there is a path in the RTL circuit between the two variables, or between the variable and the comparator, with only multiplexors on the path.

Figure 9:
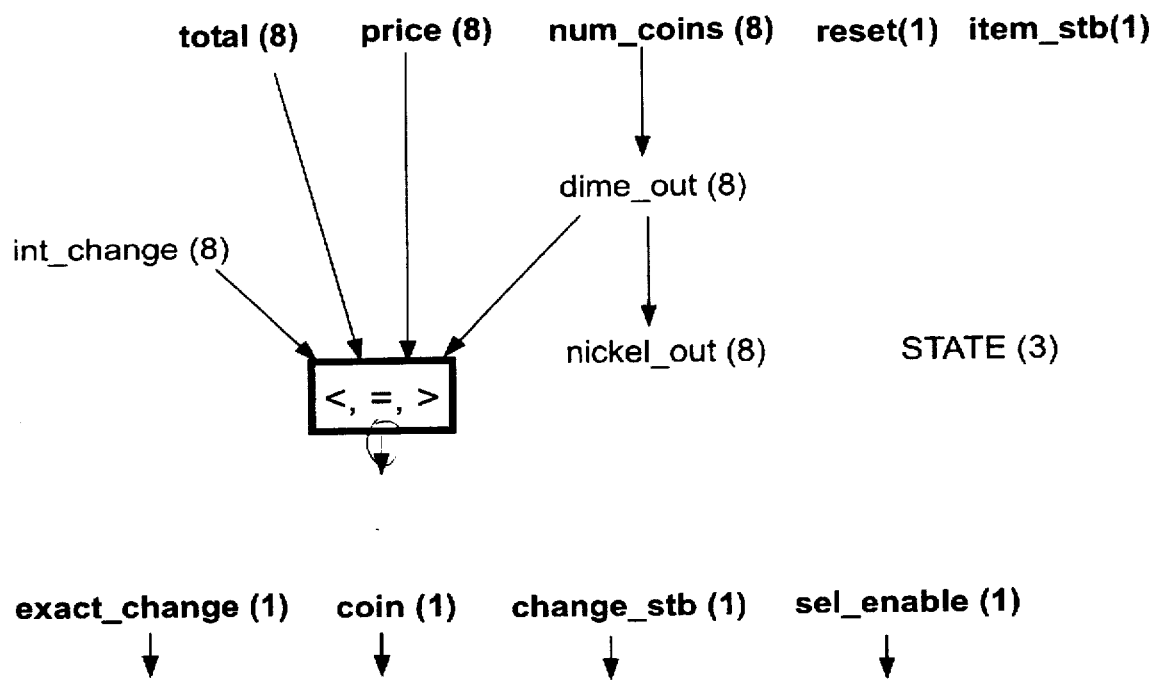
FIG. 9 is connectivity graph for the chang_maker circuit.

The connectivity graph for the change_maker circuit is shown in FIG. 9. The bitwidth of each variable is given. For example, the bitwidth of the variable state is 3 and it is not connected to any other variable in the graph.

II. The graph is used to build multiple chains, such that every variable is included in one chain. When building an augmented scan chain, the comparator output is connected directly to a register whose output is a primary output. While creating the scan chains, every attempt is made to create the maximum number of parallel chains while, at the same time, introducing the minimum number of connections between nodes in the connectivity graph.

III. Once the scan chains are identified, three main steps are required to insert the test structures into the RTL circuit.
1. Add a test input to the circuit.
2. For every connection that is required by a chain but does not exist in the original connectivity graph, a multiplexor is introduced and the test input is connected to the select input of the multiplexor.
3. For every connection between two variables in a chain that also exist in the connectivity graph, there is a path between the variables in the RTL circuit with only multiplexors in them. Control logic is derived for the multiplexors that activate the path during the test mode. For example, in FIG. 4, the control signals for the two multiplexors between YIN and Y are OR'ed with the test signal. The control added ensures that in the test mode, test is high, and YIN gets loaded into Y.

IV. After the RTL circuit is resynthesized with the test structures in place, combinational test patterns are generated with a gate-level combinational test pattern generator such as those known in the art.

When using augmented chains, the response of the combinational circuit to the test patterns also needs to be computed. The test response is obtained by using a logic simulation tool, also known in the art, and is called the test response pattern set. The test patterns and simulation results are used to generate sequential tests for the circuit under consideration.

V. The last step in the testing method converts the combinational test pattern set and the test response pattern set into a set of sequential vectors which are applied to the primary inputs of the circuit.

To illustrate this step for the change_maker circuit, we need only consider the registers in the augmented scan chain of FIG. 10 which are dime_out, nickel_out, int_change and exact_change. The inputs to the augmented scan chain are num_coins and total, and the chain also consists of a comparator.

In the 1st clock cycle, the pattern "00000000" is applied to input num_coins as shown in FIG. 10. In the 4th clock cycle, the applied pattern is shifted to the register int_change. The pattern "00000001" is applied to the input total in the 4th clock cycle. In the test mode, since int_change and total are the inputs to the comparator, the above patterns are infact, inputs to the comparator and they produce a '0' at the output of the comparator.

The '0' is loaded into exact_change in the 5th clock cycle as required by test pattern 1. The patterns $I_1$, $NO_1$ and $D_1$ are applied to input num_coins, and are shifted into registers int_change, nickel_out and dime_out by the 5th clock cycle. Hence, by the 5th clock cycle, the registers in the augmented scan chain are loaded as required by test pattern 1. Also, as required by test pattern 1, the patterns $T_1$ and $NC_1$ are applied to the primary inputs total and num_coins in the 5th clock cycle.

The patterns are applied to the combinational part of the circuit, and the response is captured in the circuit registers. The response captured in exact_change is directly observable at the circuit output. However, the responses captured in registers int_change, nickel_out and dime_out can not be directly observed at the output.

The procedure for analyzing the pattern captured in int_change for captured faults is now described. The pattern expected to be captured in register int_change by applying test pattern 1 is $I_1^R$. If there is a fault in the circuit, and the effect of the fault is captured in a FF of register int_change, then the response captured in int_change will be different from $I_1^R$, else it will be $I_1^R$. To detect if a fault has been captured in register int_change, the pattern $I_1^R$ itself is applied to the input total in the 6th clock cycle Since total and int_change are inputs to the comparator in the test mode, a '1' will be produced at the output of the comparator if the pattern captured in int_change is $I_1^R$, else it will be '0'. The result is propagated to the circuit output through exact_change and can be observed in the 7th clock cycle to determine if a fault has been captured in int_change.

Similarly, the expected responses for nickel_out and dime_out are applied to input total in the $7^{th}$ and $8^{th}$ clock cycles. They are compared with the responses captured in nickel_out and dime_out which would have shifted into register int_change in the $7^{th}$ and $8^{th}$ clock cycles respectively. If a '0' is observed at the output exact_change in the 8th or 9th cycle, then the response in nickel_out or dime_out respectively are faulty.

Experimental Results

In this section, we summarize the results of applying the H-SCAN testing scheme to two RT-level designs, implementing the GCD algorithm, and the change_maker process in a vending machine controller described previously.

The RT-level designs were obtained from behavioral specifications using a known, high-level synthesis tool, SECONDS. (See, for example, S. Bhattacharya, S. Dey, and F. Brglez, "Clock Period Optimization During Resource Sharing and Assignment", which appeared in the *Proceedings of the 31st ACM/IEEE Design Automation Conference*, pp. 195–200, June 1994) The RT-level circuits are then synthesized to equivalent gate-level circuits using another known, synthesis system. The characteristics of the resultant GCD and change_maker circuits are shown in Table 3 and the test generation results are shown in Tables 4 and 5 respectively.

With respect to the results shown in Table 3, there is given the size of the circuit in terms of RT Level components, and also gate level components. For example, the GCD circuit has six functional units column FUs. The six FUs consist of one subtract unit and three comparators which have 16 bit wide data inputs, and two 1 bit comparator units. There are 178 one bit multiplexors in the GCD circuit (column Muxes), and six registers (column Reg). The registers may have different number of FFs.

Register Y has 16 FFs, while RDY has only 1. The total number of FFs for all the registers are 68 (column FFs), while the total number of gates for GCD is 1189 (column Gates).

The change_maker circuit has six functional units, 134 one bit multiplexors and eight registers. The six functional units are comprised of two subtract units and two comparators with 8 bit wide data inputs, and two 1 bit comparator units.

With reference now to tables 4 and 5, there is shown the results of applying a full-scan scheme and H-SCAN on the GCD and the change_maker circuit respectively. For each RT-level design, the row ORIG shows the original circuit without any scan, and the row FSCAN shows the full-scan circuit with the traditional scan chain inserted using known tools, and the row HSCAN shows the circuit produced by applying the method of the present application to the original RT-level circuit.

The test hardware reported not only includes logic such as scan FFs and muxes, but also interconnects. For example, in a full-scan design of the GCD, the 69 interconnects are required to thread the 68 scan FFs into a scan chain. Also, the test input has to be routed to the 68 scan FFs, creating 68 extra interconnects. Thus, a total of 137 interconnects are introduced by the full-scan scheme. The three extra pins are for scanin, scanout and test. Since H-SCAN uses circuit input and outputs for loading and unloading patterns into circuit FFs, it requires only one extra pin, the test pin.

To demonstrate the difference in the area overhead due to the traditional full-scan implementation and that due to the method of the present application, the layout area for each version is reported. Specifically the column Test Area Overhead reports the area overhead, including both the active and wiring overhead, and the overhead of buffering high fanout signals such as test, in implementing the traditional and proposed schemes. Since the test signal has significantly less fanout for the HSCAN implementation compared to the FSCAN implementation, fewer buffers are introduced for the HSCAN scheme. In the case of the GCD design, the area overhead of implementing traditional full-scan is 17%, while the area overhead of HSCAN is only 5%, a reduction of more than 70% in test area overhead. Similarly, the reduction of test area overhead for the change_maker is 50%.

The tables also show the results of test generation for the original, full-scan, and HSCAN circuits. For the original circuit (without scan), test pattern generation was performed using a known, sequential ATPG tool HITEC, which was described by T. M. Niermann and J. H. Patel in an article entitled, "HITEC: A test Generation Package for Sequential Circuits", which appeared in *Proc. EDAC*, pp.214–218, 1991.

For the FSCAN circuit, ATPG was performed using another, known combinational ATPG tool, TRAN, which was described by S. T. Chakradhar, V. D. Agrawal and S. G. Rothweiler in an article entitled "A Transitive Closure Algorithm for Test Generation" which appeared in the *IEEE Transactions on Computer Aided Design*, Vol. 9 (No. 7): 1015–1028, July 1993. For the HSCAN circuit, combinational test patterns were first generated using the tool and then automatically converted to sequential test patterns as previously described. Finally, the generated test patterns are applied by a sequential fault simulator to measure the effectiveness of the patterns on the HSCAN circuit.

Column Faults shows the number of faults considered by HITEC for the original circuit, the number of faults considered TRAN for the FSCAN circuit, and the number of faults considered by the sequential fault simulator for the HSCAN circuit.

In these experiments, to the advantage of the full-scan scheme, the faults in the scan chain were not considered, while the faults in the test hardware introduced by H-SCAN were considered. The columns FC and TE report the percentage fault coverage and the percentage test efficiency obtained for the original, full-scan, and HSCAN circuits by HITEC, TRAN, and the proposed technique. For example, in the case of GCD, while the original circuit has only 80% test efficiency, the full-scan method obtained 100% test efficiency while the HSCAN method of the present application obtained a comparable efficiency of 99.7%. Note that the HSCAN method could achieve comparable test efficiency without using the traditional full-scan scheme, with a significantly less area overhead than the traditional full-scan technique.

Column TAT reports the number of clock cycles needed to apply the test vectors. For the GCD example, we see more than 10 times reduction in the test application time using the proposed HSCAN scheme.

In the case of the change_maker example, the HSCAN method reduced the test application time 5 times compared to full-scan, while due to output pin limitation, existing parallel scan schemes cannot achieve such reduction in test application time overhead.

While the invention has been shown and described in detail in the context of a preferred embodiment, it will be apparent to those skilled in the art that variations and modifications are possible without departing from the broad principles and spirit of the invention which should be limited solely by the scope of the claims appended hereto.

TABLE 1

Test Patterns and Test Response for change_maker Circuit.

| | Test Pattern | | | | | | Test Response | | |
|---|---|---|---|---|---|---|---|---|---|
| Pattern | total | num coins | int change | nickel out | dime out | exact change | int change | nickel out | dime out |
| 1 | $T_1$ | $NC_1$ | $I_1$ | $NO_1$ | $D_1$ | '0' | $I_1^R$ | $NO_1^R$ | $D_1^R$ |
| 2 | $T_2$ | $NC_2$ | $I_2$ | $NO_2$ | $D_2$ | '1' | $I_2^R$ | $NO_2^R$ | $D_2^R$ |

TABLE 2

Sequential Test Patterns for the change_maker Circuit.

| | Clock Cycle | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| num coins | 0...0 | $I_1$ | $NO_1$ | $D_1$ | $T_1$ | 0...0 | $I_2$ | $NO_2$ | $D_2$ | $T_2$ | X | X | X |
| total | X | X | X | 0...1 | $NC_1$ | $I_1^R$ | $NO_1^R$ | $D_1^R$ | 0...0 | $NC_2$ | $I_2^R$ | $NO_2^R$ | $D_2^R$ |

TABLE 3

Circuit Size Statistics

| | RT Level | | | Gate Level | |
|---|---|---|---|---|---|
| | FUs | Muxes | Reg | Gates | FFs |
| GCD | 6 | 178 | 6 | 1189 | 68 |
| change_maker | 6 | 134 | 8 | 831 | 31 |

TABLE 4

Results for GCD
(SFF = Scan FF, I = Interconnect, P = Pin, M = MUX, G = Gate)

| Test Hardware | | Layout Area ($mm^2$) | Test Area Overhead | # of Faults | FC | TE | TAT |
|---|---|---|---|---|---|---|---|
| ORIG | — | 7.67 | — | 2391 | 79.0% | 80.0% | 783 |
| FSCAN | 68 SFF + 137 I + 3 P | 8.97 | 17% | 2357 | 97.6% | 100% | 18007 |
| HSCAN | 19 M + 5 G + 38 I + 1 P | 8.04 | 5% | 2530 | 97.4% | 99.7% | 1618 |

TABLE 5

Results for change_maker
(SFF = Scan FF, I = Interconnect, P = Pin, M = MUX, G = Gate)

| Test Hardware | | Layout Area ($mm^2$) | Test Area Overhead | # of Faults | FC | TE | TAT |
|---|---|---|---|---|---|---|---|
| ORIG | — | 3.58 | — | 1677 | 72.0% | 78.0% | 349 |
| FSCAN | 31 SFF + 63 I + 3 P | 4.03 | 13% | 1669 | 90.2% | 100% | 4606 |
| HSCAN | 14 M + 8 G + 28 I + 1 P | 3.87 | 8% | 1816 | 95.0% | 99.9% | 858 |

What is claimed is:

1. A method for testing a register transfer specification of a circuit comprising the steps of:

extracting a connectivity graph from the register transfer specification;

generating an H-SCAN graph having a set of H-SCAN chains from the connectivity graph;

inserting a minimum number of multiplexors into the register transfer specification thereby creating the H-SCAN chains; and converting given combinational test patterns into a set of sequential test patterns which can be applied to the circuit using all of said H-SCAN chains of the above steps.

2. The method according to claim 1 wherein said H-SCAN generating step comprises:

reusing a maximum number of existing paths in the connectivity graph thereby creating a maximum number of parallel H-SCAN chains such that test area overhead and test application time are minimized.

3. The method according to claim 1 wherein said connectivity graph describes all of the paths in the circuit between registers, equal to comparators, and primary inputs and primary outputs which pass through multiplexors.

4. The method according to claim 2 wherein said connectivity graph describes all of the paths in the circuit between registers and primary inputs and primary outputs which pass through multiplexors.

5. The method according to claim 1 wherein said converting step maintains fault coverage achieved by the combinational test patterns.

6. The method according to claim 1 wherein said H-SCAN generating step comprises:

reusing one or more comparators contained in the register transfer specification, when the number of primary outputs to the circuit is less than than the number of primary inputs to the circuit to maximize the number of parallel H-SCAN chains such that the test application time is further reduced.

* * * * *